United States Patent
Singh et al.

(10) Patent No.: US 11,632,105 B2
(45) Date of Patent: Apr. 18, 2023

(54) FAST OVERCURRENT DETECTION IN BATTERY MANAGEMENT SYSTEM

(71) Applicant: Analog Devices International Unlimited Company, Limerick (IE)

(72) Inventors: Gaurav Singh, Lucknow (IN); Wreeju Bhaumik, Bangalore (IN)

(73) Assignee: Analog Devices International Unlimited Company, Limerick (IE)

( * ) Notice: Subject to any disclaimer, the term of this patent is extended or adjusted under 35 U.S.C. 154(b) by 34 days.

(21) Appl. No.: 17/219,025

(22) Filed: Mar. 31, 2021

(65) Prior Publication Data

US 2022/0321114 A1 Oct. 6, 2022

(51) Int. Cl.
| | |
|---|---|
| H03K 17/082 | (2006.01) |
| G01R 31/3835 | (2019.01) |
| G01R 31/367 | (2019.01) |
| G01R 19/165 | (2006.01) |

(52) U.S. Cl.
CPC ..... *H03K 17/082* (2013.01); *G01R 19/16571* (2013.01); *G01R 31/367* (2019.01); *G01R 31/3835* (2019.01)

(58) Field of Classification Search
CPC ............ H03K 17/082; G01R 19/16571; G01R 31/367; G01R 31/3835
USPC ...................................................... 361/93.1
See application file for complete search history.

(56) References Cited

U.S. PATENT DOCUMENTS

| | | |
|---|---|---|
| 4,038,695 A | 7/1977 | Depuy |
| 4,782,422 A | 11/1988 | Jones et al. |
| 5,019,936 A | 5/1991 | Zylstra et al. |
| 5,598,086 A * | 1/1997 | Somerville ....... H02J 7/007184 320/148 |
| 5,723,915 A | 3/1998 | Maher et al. |
| 7,015,702 B2 | 3/2006 | Rupp |
| 7,126,509 B2 | 10/2006 | Sit et al. |
| 7,352,166 B1 | 4/2008 | Blom |
| 7,714,757 B2 | 5/2010 | Denison et al. |
| 8,299,767 B1 | 10/2012 | Tuozzolo et al. |
| 8,897,727 B2 | 11/2014 | Wang et al. |

(Continued)

FOREIGN PATENT DOCUMENTS

| | | |
|---|---|---|
| CN | 115144776 A | 10/2022 |
| EP | 1563608 B1 | 12/2011 |

(Continued)

OTHER PUBLICATIONS

Palani, Ramesh, "Design of PVT Tolerant Inverter Based Circuits for Low Supply Voltages", PhD diss. U. of Minnesota, (Jun. 2015), 210 pgs.

(Continued)

*Primary Examiner* — Thienvu V Tran
*Assistant Examiner* — Sreeya Sreevatsa
(74) *Attorney, Agent, or Firm* — Schwegman Lundberg & Woessner, P.A.

(57) ABSTRACT

Improved overcurrent detection and mitigation systems, methods, and techniques for a BMS are described herein. A BMS monitor may detect an overcurrent using two different techniques. The first technique may detect an overcurrent based on average power over different, overlapping time periods. The second technique may detect an overcurrent based on determining a modeled junction temperature of a switching device.

19 Claims, 8 Drawing Sheets

(56) References Cited

U.S. PATENT DOCUMENTS

| | | |
|---|---|---|
| 9,520,772 B2 | 12/2016 | He et al. |
| 9,621,043 B2 | 4/2017 | Kimura et al. |
| 9,634,481 B2 | 4/2017 | Eddleman et al. |
| 10,191,453 B2 | 1/2019 | Pavlovic et al. |
| 10,374,444 B2 | 8/2019 | Worry et al. |
| 10,819,290 B2 | 10/2020 | Ranta et al. |
| 2010/0046123 A1 | 2/2010 | Fukami |
| 2013/0293139 A1* | 11/2013 | Sadwick ............... H05B 45/28 |
| | | 315/224 |
| 2016/0077135 A1 | 3/2016 | Jö̈ckel et al. |
| 2016/0218501 A1* | 7/2016 | Eddleman ............... H01C 1/16 |
| 2017/0356939 A1 | 12/2017 | Hurwitz et al. |
| 2018/0252748 A1 | 9/2018 | Wood et al. |
| 2020/0256894 A1 | 8/2020 | Zhang et al. |

FOREIGN PATENT DOCUMENTS

| | | |
|---|---|---|
| EP | 3700038 | 8/2020 |
| JP | 2006191564 A | 7/2006 |
| WO | 9012438 | 10/1990 |
| WO | WO-2016138807 A1 | 9/2016 |

OTHER PUBLICATIONS

"European Application Serial No. 22161512.3, Extended European Search Report dated Dec. 5, 2022", 10 pgs.
"European Application Serial No. 22182916.1, Extended European Search Report dated Dec. 6, 2022", 10 pgs.

* cited by examiner

FAST OVERCURRENT DETECTION IN BATTERY MANAGEMENT SYSTEM

TECHNICAL FIELD

The present disclosure generally relates to safety techniques and mechanisms for a Battery Management System (BMS), such as overcurrent detection.

BACKGROUND

With the rapidly evolving technology of smart grid and electric vehicles (EVs), the rechargeable battery has emerged as a prominent energy storage device at scale. A BMS monitors rechargeable batteries to provide relevant data to control systems, such as battery charge level. BMSs can have a variety of applications ranging from grid energy storage to electric vehicles to other consumer products like e-bikes, e-scooters, and so forth.

Rechargeable batteries, being electrochemical in nature, may exhibit a variety of undesirable operational characteristics such as outgassing, leakage of electrolyte, or thermal issues such as overheating or exothermically reacting with oxygen. One such undesirable condition is an overcurrent condition, where a larger than intended current is sourced or sunk by an individual cell or battery cell stack. Overcurrent can lead to overheating or even thermal runaway.

A switching mechanism, such as a mechanical relay, may be provided to selectively connect and disconnect the battery from its corresponding load (e.g., an electric vehicle (EV) traction motor or related control circuitry) when the battery is malfunctioning. However, a mechanical relay can be expensive, slow, and bulky.

BRIEF DESCRIPTION OF THE DRAWINGS

Various ones of the appended drawings merely illustrate example embodiments of the present disclosure and should not be considered as limiting its scope.

DETAILED DESCRIPTION

Figure 1:
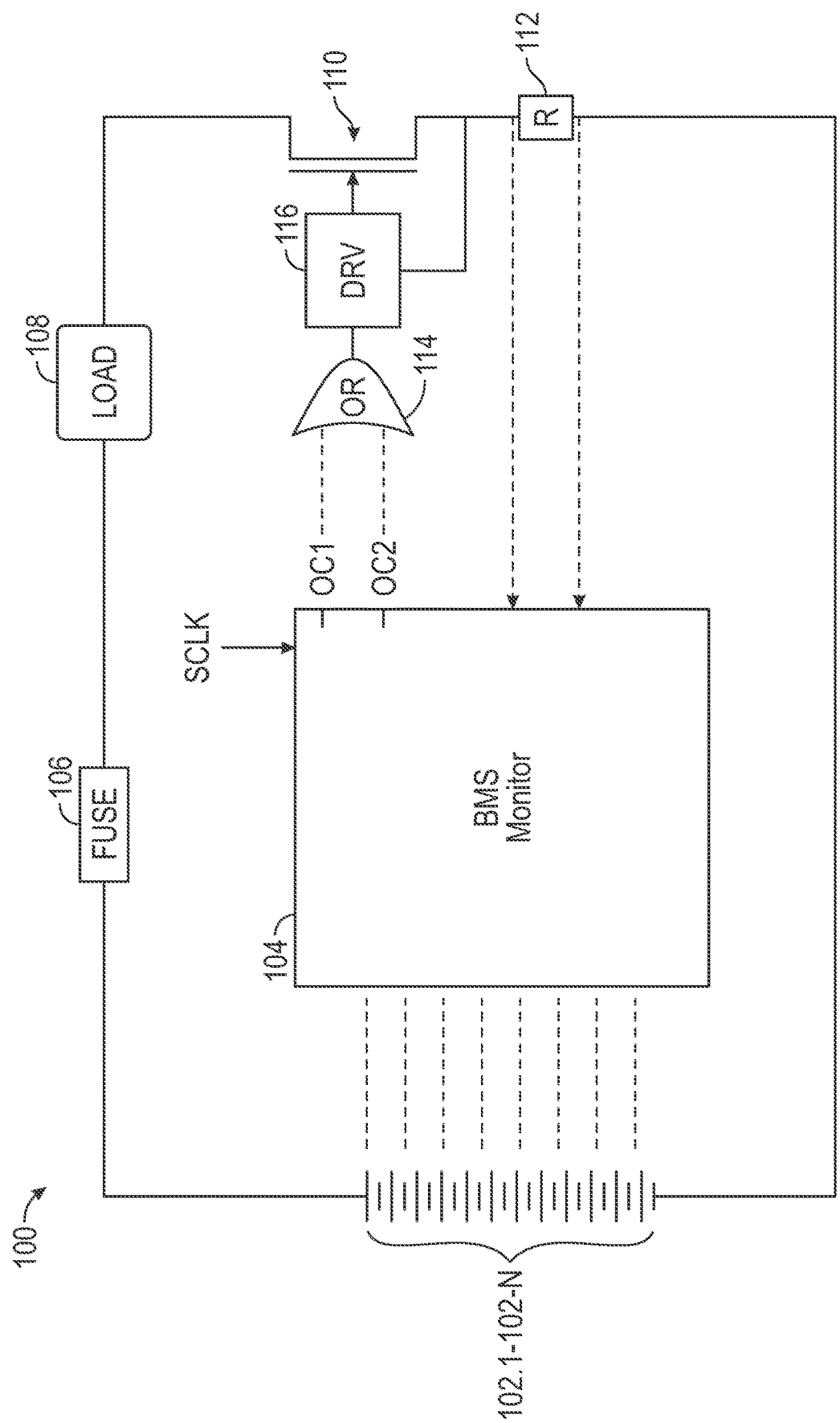
FIG. 1 a block diagram of example portions of a BMS.

Embodiments of the present disclosure provide improved overcurrent detection and mitigation systems, methods, and techniques used in a Battery Management System BMS. The BMS may be provided in an EV. A BMS monitor may detect an overcurrent using two different techniques, providing redundancy and increasing reliability. The first technique may detect an overcurrent based on average power over different, overlapping time periods. The second technique may detect an overcurrent based on determining a modeled junction temperature of a switching device, such as a semiconductor element, coupling the battery to a load. Both techniques may take into account historical information of the circuit performance, such as past current glitches. If an overcurrent is detected by either technique, the switching device may be quickly disabled, preventing the switching device from failing. Therefore, the overcurrent detection techniques described herein improve the safety and reliability of a BMS while reducing costs.

This document describes battery monitor for protecting a switching device used to supply power to a load. The battery monitor may include a converter circuit with an input to receive a voltage, and an oscillator to generate a pulse sequence based on the voltage. The battery monitor may also include a digital circuit with a first detector to detect an occurrence or non-occurrence of a first fault event for the switching device based on a determined characteristic of the pulse sequence measured over at least two different time windows and a a second detector to detect an occurrence or non-occurrence of a second fault event for the switching device by determining a modeled junction temperature of the switching device based on the pulsing sequence.

This document also describes a method to protect a switching device used to supply power to a load. The method may include detecting an input voltage; generating a pulse sequence based on the input voltage; determining an occurrence or non-occurrence of a first fault event for the switching device based on a determined characteristic of the pulse sequence measured over at least two different time windows; determining an occurrence or non-occurrence of a second fault event for the switching device by determining a modeled junction temperature of the switching device based on the pulsing sequence; and disabling operation of the switching device, in response to determining the occurrence of the first or second fault events.

This document further describes an apparatus for protecting a switching device used to supply power to a load. The apparatus may include a converter circuit with an input to receive a voltage, and an oscillator to generate a pulse sequence based on the voltage. The apparatus may also include a fault detector including a plurality of timing filters and comparators to: determine power dissipated over a plurality of time windows based on the pulse sequence; for each time window of the plurality of time windows, compare the power dissipated for that time window to a respective power threshold for that window; based on the comparing, detecting an overcurrent event; and in response to detecting the overcurrent event, disabling the switching device.

FIG. 1 illustrates a block diagram of example portions of a BMS 100. The BMS 100 may include a plurality of battery cells 102.1-102.N, a BMS monitor 104, a fuse 106, a load 108, a switching device 110, a shunt resistor 112, an OR logic gate 114, and a drive circuit 116.

The battery cells 102.1-102.N may be provided as a battery module for a battery pack. For example, the battery pack may use a Lithium Ion chemistry and provide a stack or other aggregation of battery cells, such as to provide a 48 volt nominal output or other desired output. Batteries with different specifications, sizes, and shapes may be used. The battery cells 102.1-102.N may be monitored by the BMS monitor 104. For example, the BMS monitor 104 may include a plurality of voltage measurement channels, e.g., 16 channels.

The BMS monitor 104 may be provided as an integrated circuit, which can include a monolithically integrated circuit or an integrated module including multiple integrated circuit die or other circuit elements within a commonly-shared integrated circuit device package, as illustrative examples. The BMS monitor 104 may include hardware and software to measure voltage, current, and/or temperature levels of the battery cells 102.1-102.N. The BMS monitor 104 may store those measurements values in a memory, such as an EEPROM. The BMS monitor 104 may also communicate those measurements to a master controller (not shown) via a communication interface using a wired network, a wireless network, or a combination thereof.

The battery cells 102.1-102.N may also be coupled to the fuse 106, the load 108, the switching device 110, and the shunt resistor 112. The load 108 may be a component receiving power from the battery cells 102.1-102.N, such as an EV traction motor. The load 108 may be fully or partially powered by battery cells 102.1-102.N. The fuse 106 may be provided for emergency situations where the battery cells 102.1-102.N need to be permanently disconnected from the load 108 (e.g., extreme overheating).

The switching device 110 may selectively connect and disconnect the battery cells 102.1-102.N to the load 108. The switching device 110 may be provided as a metal-oxide-semiconductor field-effect transistor (MOSFET). For example, the switching device 110 may be provided as a silicon carbide (SiC) MOSFET configured to operate at high voltages. MOSFETs provide advantages over mechanical relays because of their lower cost and faster response times. However, MOSFETs may have lower fault tolerances such that MOSFETs may be more easily damaged by battery malfunction events, such as overcurrent. Moreover, a MOSFET, when used as switching device 110, may be one of the first devices to fail in the circuit. When a MOSFET fails, it often fails as a short. This failing-short characteristic may cause catastrophic failure of one or more cells because it creates a short circuit between the battery cells 102.1-102.N and the load 108. Although the fuse 106 may be blown out before significant damage is done, the blown fuse 106 may render the incorporating device (e.g., load) unusable. In the example of an EV, the EV may be rendered undrivable and may have to be taken to a service station and undergo costly repairs.

Thus, the BMS monitor 104 may disable (e.g., turn off, constrain operation) the switching device 110 (e.g., MOSFET) in certain situations, such as overcurrent situations. The BMS monitor 104 may detect a voltage across the shunt resistor 112. From the detected voltage, it may detect an overcurrent event and then switch the switching device 110 off in a relatively fast time before the switching device 110 (e.g., MOSFET) can fail. In this example, the BMS monitor 104 may detect the overcurrent event by using two different techniques (OC1 and OC2), as described in further detail below. If either of the OC detection techniques indicate an overcurrent event, the output of the OR logic gate 114 may trigger the drive circuit 116 to disable the switching device 110. The OR logic gate 114 and/or driver circuit 116 may be integrated with the BMS monitor 104.

Some overcurrent detection techniques may not be able to accurately detect overcurrent events for the switching device 110. Current flow can include transients due to switching in the load 108 (e.g., EV traction motor), thus defining an overcurrent event as simply 'a current exceeding a threshold for a certain period of time' may not be effective in protecting the switching device 110.

Figure 2A:
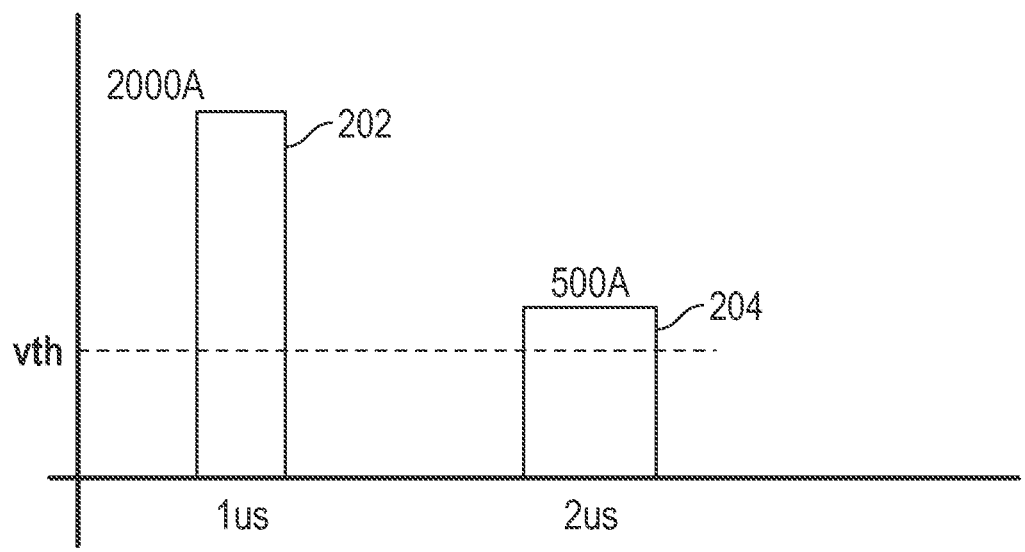
FIGS. 2A-2b show examples of current spikes in a system.
Figure 2B:
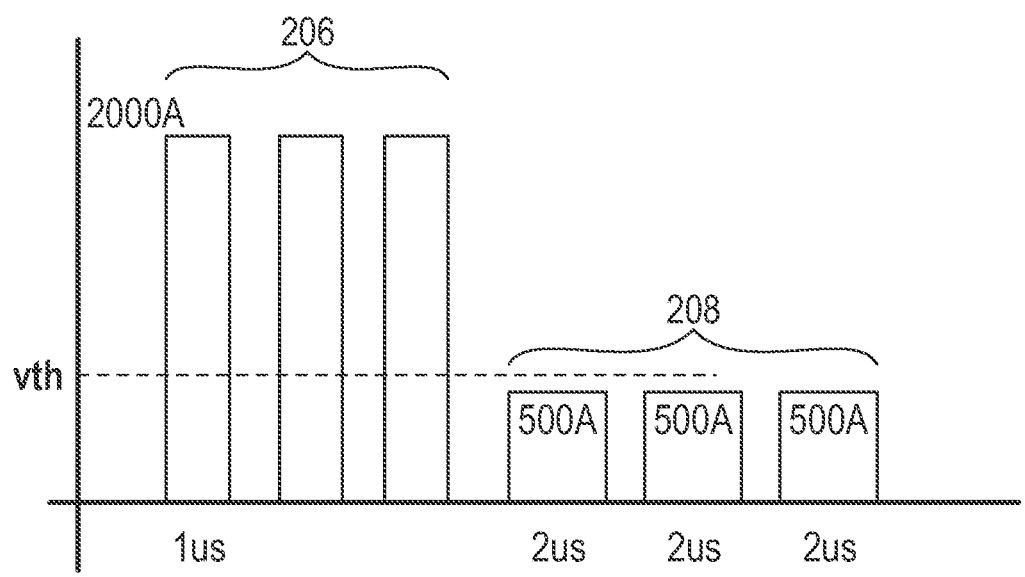

FIGS. 2A-2B show examples of current spikes in a system. FIG. 2A shows two spikes (or glitches): a first spike 202 with a magnitude of 2000 A for a duration of 1 microsecond and a second spike 204 with a magnitude of 500 A for a duration of 2 microseconds. Consider that a threshold for detecting an overcurrent event is set for current spikes over 400 A for a duration of at least 2 microseconds. Here, the second spike 204 (500 A for a duration of 2 microsecond) will be detected as an overcurrent event while the first spike 202 (2000 A for a duration of 1 microsecond) will not. This may be problematic because the first spike 202 may dissipate eight times the energy in a switching device (e.g., MOSFET) as compared to the wider second spike 204.

Moreover, failure of a switching device (e.g., MOSFET) may depend on the history of the current (and power and heat dissipated) in the system rather than a current at a single point in time. FIG. 2B shows a first set of current spikes 206, each with a magnitude of 2000 A for a duration of 1 microsecond spike, and second set of current spikes 208, each with a magnitude of 500 A for a duration of 2 microseconds. Consider that a threshold for detecting an overcurrent event is set for current spikes over 600 A for a duration of at least 2 microseconds. Here, none of the spikes either in the first set or the second set of spikes 206, 208 may trigger detection of an overcurrent event. This can be problematic because each spike may generate an amount of heat in the switching device (e.g., MOSFET) and the successive nature of the spikes may lead to overheating of the switching device leading to a failure of the switching device. Hence, overcurrent of a switching device, such as a MOSFET, may be based not just on the amount of current at a particular time but also on the history of the circuit performance.

Figure 3:
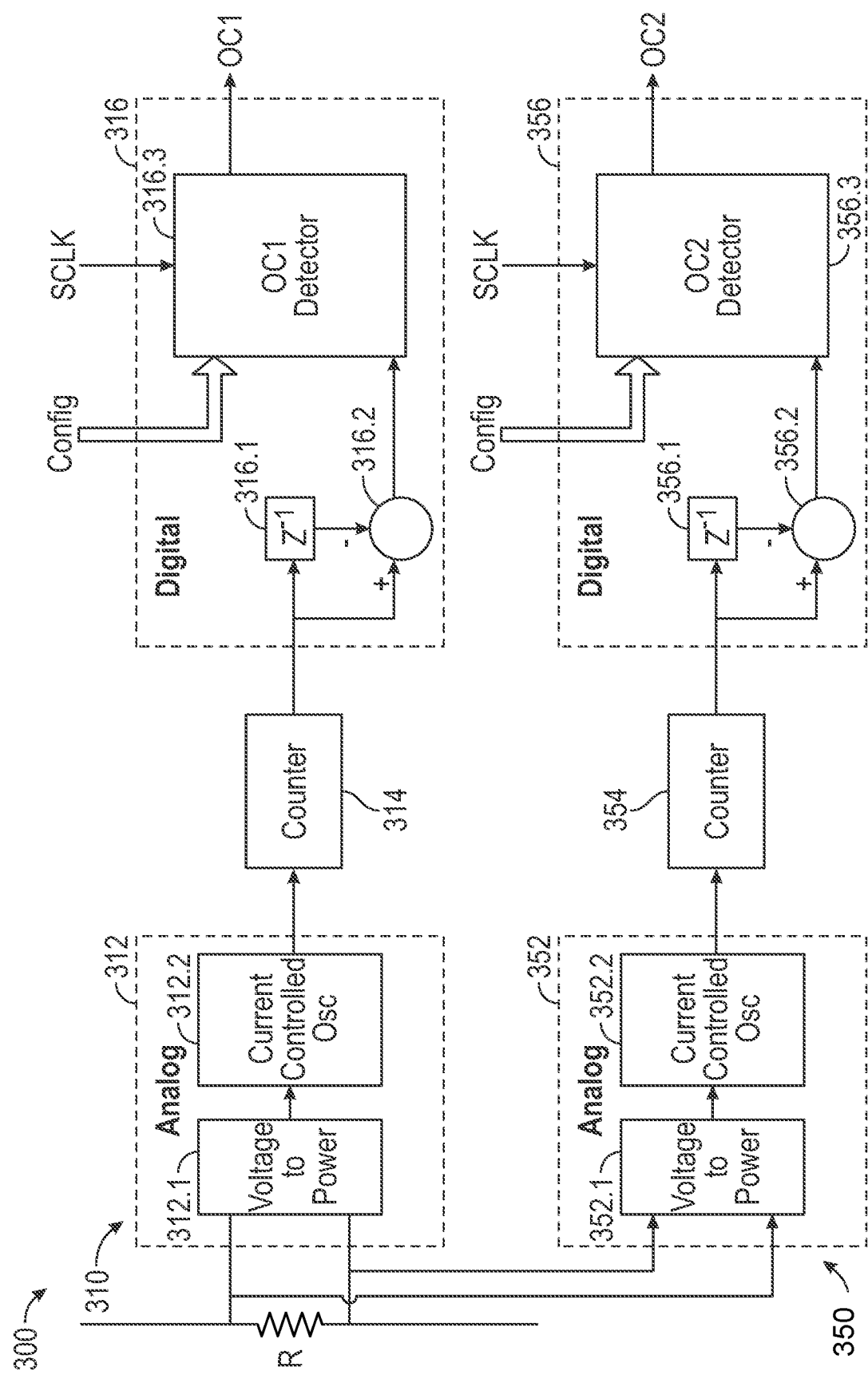
FIG. 3 illustrates an example portion of a BMS monitor.

FIG. 3 illustrates an example portion of a BMS monitor 300. The BMS monitor 300 may detect a voltage across a shunt resistor R (e.g., shunt resistor 112 of FIG. 1). Based on the detected voltage, the BMS monitor 300 may detect overcurrent events based on two different detection techniques, detecting overcurrent event 1 (OC1) and event 2 (OC2), respectively. As explained above with reference to FIG. 1, the generation of either overcurrent events (OC1 and/or OC2) may trigger the disabling a switching device, such as a MOSFET (e.g., switching device 110 of FIG. 1).

The BMS monitor 300 may include two processing chains 310, 350 corresponding to the two different fault detection techniques. The first processing chain 310 may include a first analog front-end circuit 312, a first counter 314, and a first digital engine 316. The first analog front-end circuit 312 may receive or detect a voltage across the shunt resistor and convert the detected voltage into a pulse sequence (or periodic pulses).

The first analog front-end circuit 312 may include a first voltage-to-power converter 312.1 and a first current controlled oscillator (CCO) 312.2. The first voltage-to-power converter 312.1 may convert the detected voltage to a power signal. The first voltage-to-power converter 312.1 may convert the detected voltage to a current signal, using for example a device having a specified transconductance characteristic. The current signal may then be squared to generate the power signal, because the square of the current may be representative of the power, $p(t)=i(t)^2 R$ where I is the current and R is the resistance. The first CCO 312.2 may convert the power signal into the pulse sequence. The pulse sequence therefore may be current-controlled. Each pulse may correspond to a "unit of energy." The frequency of the pulse sequence may be proportional to the square of the detected voltage. For example, if the detected voltage of 1 V generates a pulse sequence with a frequency of 1 Hz, then the 2 V detected voltage may generate a pulse sequence with a frequency of 4 Hz (square of 2 V).

The first counter 314 may count the number of pulses in the generated pulse sequence. The first counter 314 may be a rotary counter or other resetting counter such that after it reaches its maximum count it may rollover and begin the count again. For example, if the count is from 1-12, after the count reaches 12, the count begins again 1. The first counter 314 may be provided as gray counter, such as a 4-bit gray counter.

The first counter 314 may be coupled to the first digital engine 316. The first digital engine 316 may be implemented using a combination of hardware and software. The first digital engine 316 may include a processor, microprocessor, digital state machines, and/or other suitable components.

The first digital engine 314 may receive the pulse sequence and may detect a first fault event, such as first overcurrent event (OC1), based on the received pulse sequence. The pulse sequence generated by the first counter 314 may be generated asynchronously since it represents the current, which can include spikes (or glitches), as discussed above. Thus, the first digital engine 314 may synchronize the pulse sequence to its system clock (SCLK). For each clock cycle (e.g., 125 nanosecond) or a set of clock cycles of the system clock, the first digital engine 314 may store a previously obtained value of the pulse sequence in register 316.1 and may subtract it from the current obtained value of the pulse sequence using subtractor 316.2 to generate an energy sequence (also referred to as a power sequence) for that clock cycle (or set of clock cycles). The energy sequence may correspond to the energy/power dissipated in the last cycle (or set of clock cycles). The first counter 314 may be of sufficient size so that it does not complete a full revolution of its count within a clock cycle of the system clock.

The first digital engine 316 may include an OC1 detector 316.3 to detect an overcurrent event based on the generated energy sequence. The OC1 detector 316.3 may detect OC1 based on the average of energy across different time periods. The OC1 detector 316.3 may use multiple exponential moving average (EMA) windows.

Figure 4:
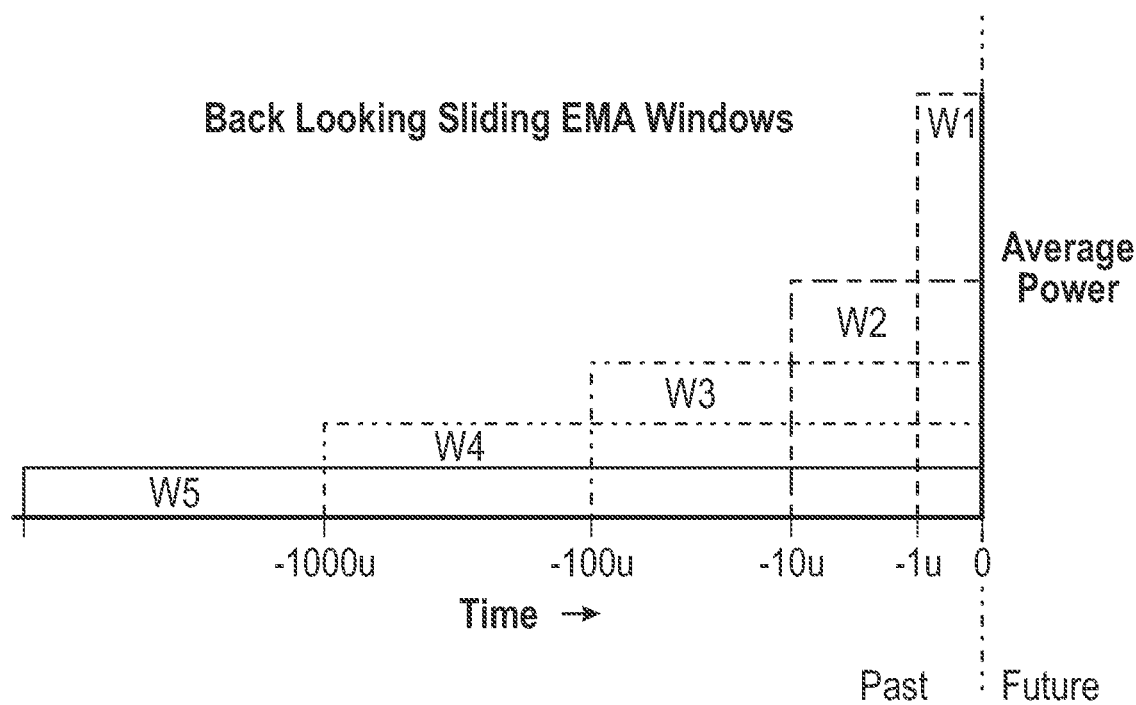
FIG. 4 illustrates examples of time windows.

FIG. 4 illustrates examples of time windows. FIG. 4 shows five time windows W1-W5. The time windows W1-W5 may be measured based on the present time looking backwards. Time window W1 may be shortest window from the present time to a first time backwards, e.g., 1 microsecond. Time window W2 may be longer than W1 from the present time to a second time backwards, e.g., 10 microseconds. Time window W3 may be longer than W2 from the present time to a third time backwards, e.g., 100 microseconds. Time window W4 may be longer than W3 from the current time to a present time backward, e.g., 1000 microseconds. Time window W5 may be longer than W4 from the present time to a fifth time backwards, e.g., 10000 microseconds. The time windows may be implemented using timing filters. The periods of the timing windows may be configurable. The periods may be configured based on time periods of a thermal ladder of a MOSFET, as discussed below in further detail.

For each time window, an average power dissipated may be determined simultaneously. The average power may be a function of the energy sequences observed during the respective time periods. Thus, in the example of FIG. 4, the average power for the time windows W1-W5 may show the power dissipated in the last 1 microsecond, 10 microseconds, 100 microseconds, 1000 microseconds, and 10000 microseconds, respectively.

Each time window may also be associated with a power threshold. The average power for each window may be compared to the respective power threshold. The individual thresholds for each window may be configurable. For example, the thresholds may be obtained based on simulations of the switching device (MOSFET). The simulations may assume a maximum permissible case temperature and junction temperature, as described in further detail below.

If the determined average power for any time window exceeds its respective power threshold, the BMS monitor 300 (e.g., OC1 detector 316.3) may determine the occurrence of the overcurrent event OC1. Using different time windows to determine a digital estimation of power dissipated may eliminate or decrease false positives of overcurrent events coming from current spikes (glitches) while also being responsive to multiple short spikes.

Referring back to FIG. 3, the second processing chain 350 is described next. The second processing chain 350 may include a second analog front-end circuit 352, a first counter 354, and a first digital engine 356. The second analog front-end circuit 352 may similar or substantially the same as the first analog front-end circuit 312. As such, the second analog front-end circuit 352 may receive or detect a voltage across the shunt resistor and convert the detected voltage into a pulse sequence (or periodic pulses).

The second analog front-end circuit 352 may include a second voltage-to-power converter 352.1 and a second current controlled oscillator (CCO) 352.2 and these components may operate the same way as their counterparts in the first analog front-end circuit 312, as described above. The second voltage-to-power converter 352.1 may convert the detected voltage to a power signal. The second voltage-to-power converter 352.1 may convert the detected voltage to a current signal, using for example a transconductor device. The current signal may then be squared to generate the power signal. The second CCO 352.2 may convert the power signal into the pulse sequence. The pulse sequence therefore may be current-controlled. Each pulse may correspond to a "unit of energy." The frequency of the pulse sequence may be proportional to the square of the detected voltage.

The second counter 354 may operate in the same way as the first counter 314 described above. The second counter 354 may be a rotary counter such that after it reaches its maximum count it may rollover the count and begin again. For example, if the count is from 1-12, after the count reaches 12, the count begins again 1. The second counter 354 may be provided as gray counter, such as a 4-bit gray counter.

In an example, one or more analog and counter components (e.g., 312 and 315, 314 and 354) in the first and second processing chains 310, 350 may be combined or integrated together. For example, a single analog front-end circuit and/or counter may be provided.

The second counter 354 may be coupled to the second digital engine 356. The second digital engine 356 may be implemented using a combination of hardware and software. The second digital engine 356 may include a processor, microprocessor, digital state machines, and/or other suitable components.

The second digital engine 356 may receive the pulse sequence and may detect a second fault event, such as a second overcurrent event (OC2), based on the received pulse sequence. The pulse sequence generated by the second counter 354 may be generated asynchronously since it represents the current, which can include spikes (or glitches), as discussed above. Thus, the second digital engine 354 may synchronize the pulse sequence to its system clock (SCLK). For each clock cycle (e.g., 125 nanosecond) or a set of clock cycles of the system clock, the second digital engine 354 may store a previously obtained value of the pulse sequence in register 356.1 and may subtract it from the current obtained value of the pulse sequence using subtractor 356.2 to generate an energy sequence (also referred to as a power sequence) for that clock cycle (or set of clock cycles). The energy sequence may correspond to the energy/power dissipated in the last cycle (or set of clock cycles). The second counter 354 may be of sufficient size so that it does not complete a full revolution of its count within a clock cycle of the system clock.

The second digital engine 356 may include an OC2 detector 356.3 to detect an overcurrent event based on the generated energy sequence. The OC2 detector 356.3 may determine a modeled (e.g., virtual) junction temperature of the switching device (e.g., MOSFET junction), compare the determined modeled junction temperature to a temperature threshold, and based on the comparison, detect the occurrence of overcurrent event OC2.

Junction temperature of a MOSFET may be a reliable indicator of its safe and proper operability. For example, certain MOSFETS may safely and properly function while their junction temperature is below 175° C. and may fail if their junction temperature exceeds 175° C. for a period of time. Therefore, an overcurrent condition may be detected based on the junction temperature of the switching MOSFET.

The actual (or real) junction temperature may be difficult to measure. But the junction temperature is related to the power dissipated by the MOSFET, and not just the instant power dissipated at a select point of time but the historical dissipated power over a period of time. Hence, the OC2 detector 356.3 may determine a modeled junction temperature based on the power dissipated by the MOSFET as detected by the energy sequence and digital representations of the thermal properties of the MOSFET.

Figure 5A:
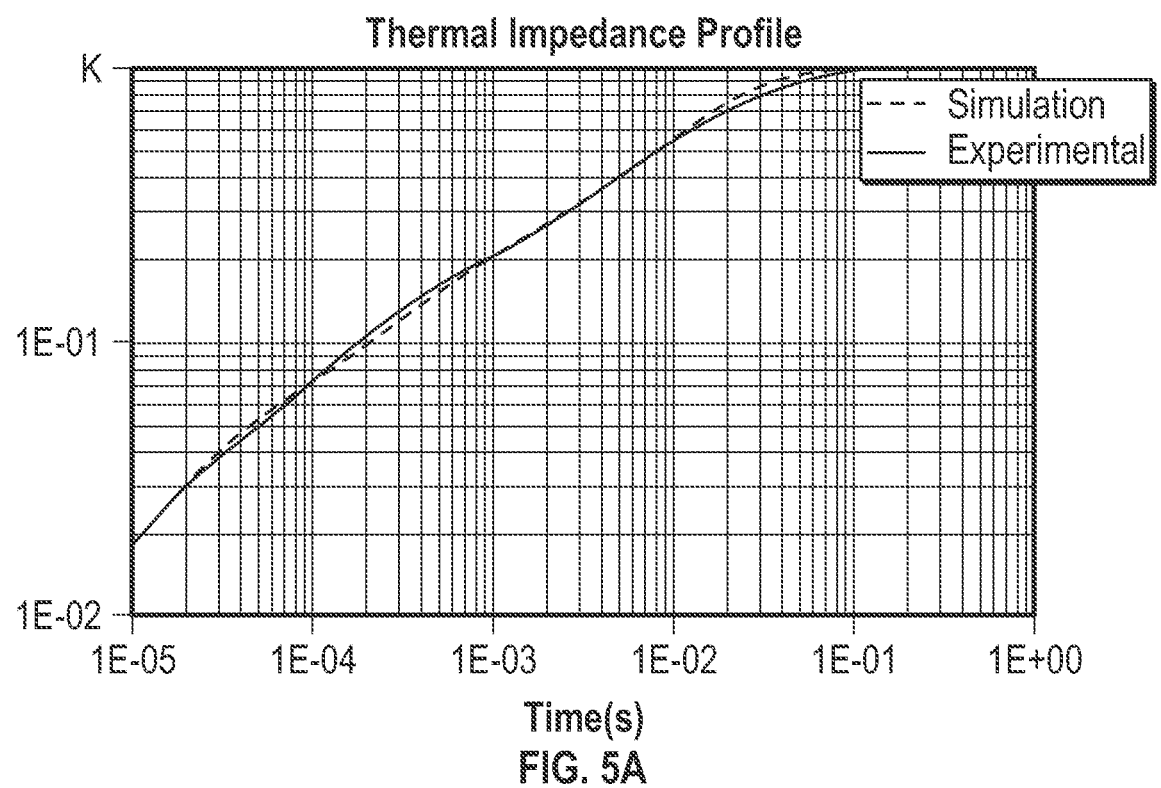
FIG. 5A illustrates a thermal impedance profile of a sample MOSFET.
Figure 5B:
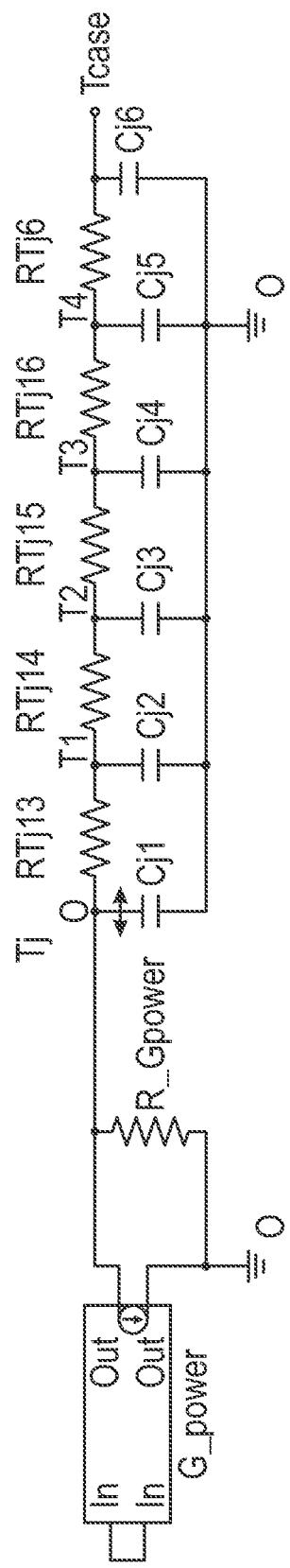
FIG. 5B shows a circuit representation of a Cauer model of a sample MOSFET

FIG. 5A illustrates a thermal impedance profile of a sample MOSFET, and FIG. 5B shows a circuit representation of a Cauer model of a sample MOSFET. In FIG. 5A, the x-axis represents a time scale, and the y-axis shows the thermal resistance (or impedance) of the sample MOSFET. The thermal resistance may correspond to the temperature difference created between the junction and the case of the MOSFET divided by the amount of energy.

A MOSFET can be modeled as a network of cascaded resistors and capacitors, known as a Cauer thermal ladder, as shown in FIG. 5B. The Cauer model may include a linear network of resistors and capacitors with an input port provided as a current proportional to power and a termination port at the other end provided as a known thermal potential, e.g., case temperature Tcase. The junction temperature Tj may be correspond to the node between the first capacitor (Cj1) and first resistor (RTj13) of the Cauer model. The values of the resistors and capacitors in the Cauer model are based on the intrinsic properties of the MOSFET, and therefore may be obtained from a digital model of the MOSFET, e.g., SPICE (Simulation Program with Integrated Circuit Emphasis) model. In an example, the digital representation may be characterized as $\Delta T/(R_i C_i)$.

Referring back to FIG. 3, the OC2 detector 356.3 may obtain the values of the Cauer model of the switching device (e.g., MOSFET), for example from the digital model of the switching device, and may convert them into digital register values. As such, these digital register values for the resistors and capacitors in the Cauer model may be configurable. Thus, based on the energy sequence and the digital Cauer Model register values, the OC2 detector 356.3 may calculate the virtual junction temperature Tj of the switching device. The OC2 detector 353.3 may then compare the virtual junction temperature Tj to a temperature threshold, e.g., 175° C. If the determined virtual junction temperature Tj exceeds the temperature threshold, the BMS monitor 300 (e.g., OC2 detector 356.3) may determine the occurrence of the overcurrent event OC2.

In response to the detection of either (or both) overcurrent events OC1 and OC2, the switching device may be disabled. These detection techniques described herein can quickly detect overcurrent events so that the switching device can be disabled in a relatively fast manner before it fails.

Figure 6B:
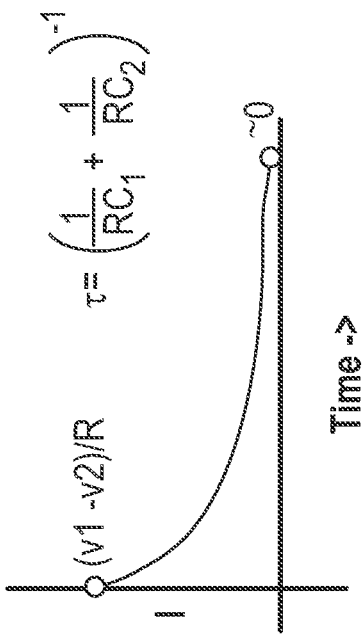
FIG. 6B shows a graph of the current flow in the binary R-C system.
Figure 6A:
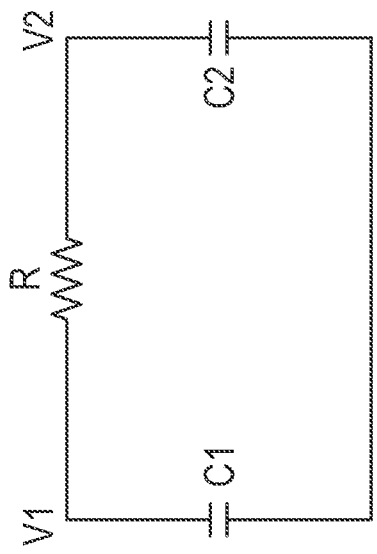
FIG. 6A shows a sample binary R-C system.

FIGS. 6A-6F will be used to describe a calculation technique of the modeled (e.g., virtual) junction temperature. FIG. 6A shows a sample binary R-C system. Here, two capacitors C1, C2 are coupled in parallel with a resistor R in between, creating a binary R-C system. FIG. 6B shows a graph of the current flow in the binary R-C system of FIG. 6A. A first potential V1 is present between C1 and R, and a second potential V2 is present between C2 and R.

V1 and V2 may be characterized as:

$$V_1[n+1] = V_1[n] - (V_1[n] - V_2[n])\left(\frac{\Delta t}{RC_1}\right), \text{ when } \Delta t \ll \tau$$

$$V_2[n+1] = V_2[n] + (V_2[n] - V_1[n])\left(\frac{\Delta t}{RC_2}\right), \text{ when } \Delta t \ll \tau,$$

n is the time cycle, $\Delta t$ is the cycle time, $\tau$ is the time constant.
V1 and V2 may also be characterized as:

$$V_1[n+1] = V_1[n] - (V_1[n] - V_2[n])\left(\frac{1 - e^{-\frac{\Delta t}{\tau}}}{(C_1 + C_2)/C_2}\right)$$

$$V_2[n+1] = V_2[n] + (V_1[n] - V_2[n])\left(\frac{1 - e^{-\frac{\Delta t}{\tau}}}{(C_1 + C_2)/C_1}\right)$$

Figure 6C:
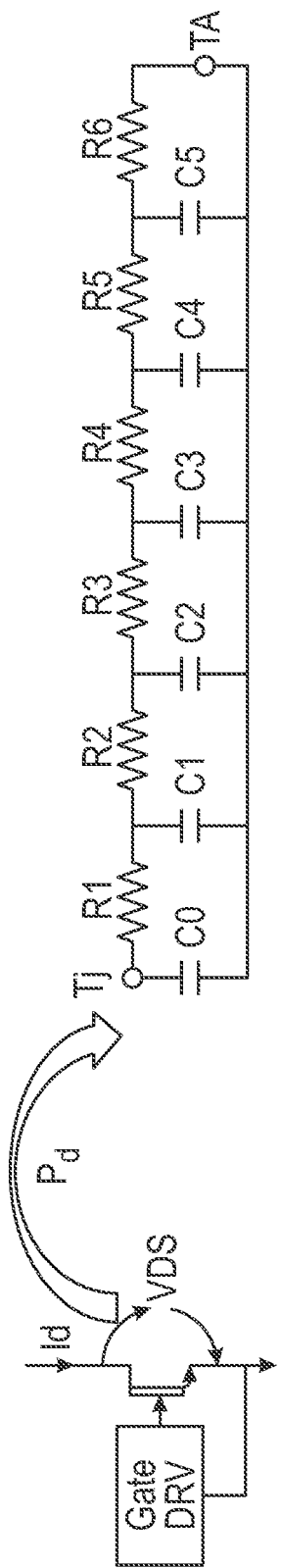
FIG. 6C shows a circuit diagram of a Cauer model of a sample MOSFET.
Figure 6D:
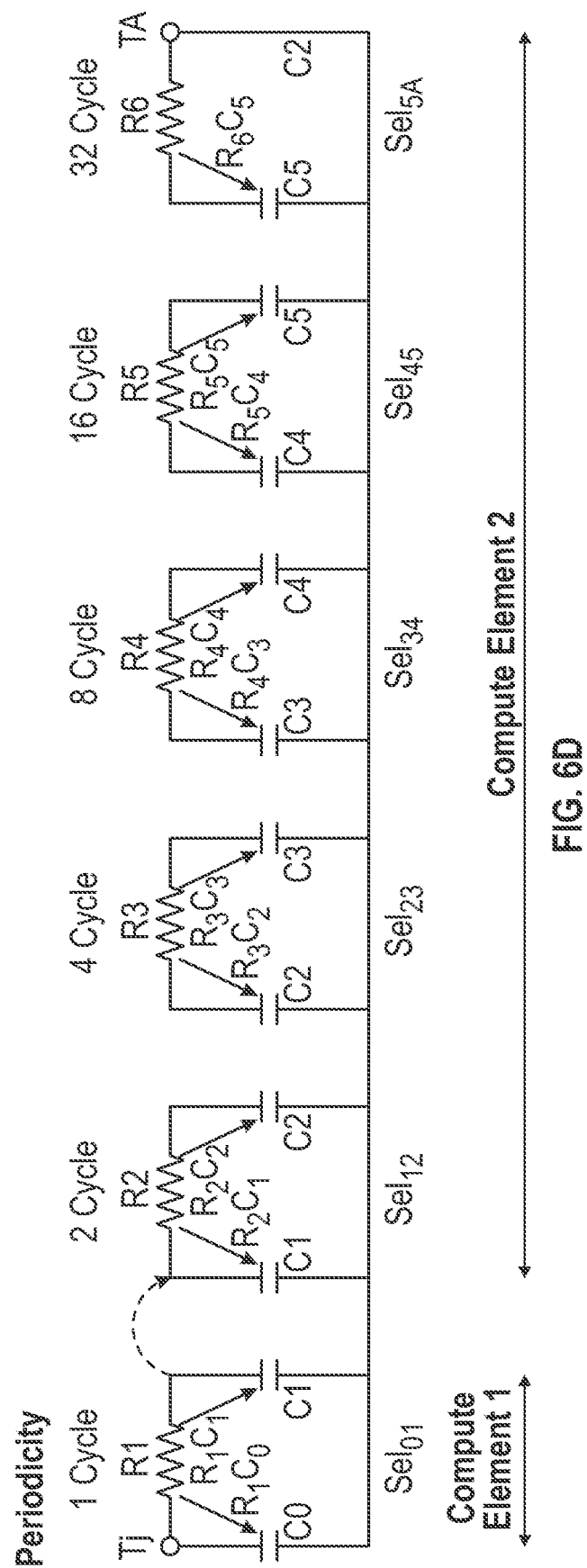
FIG. 6D shows sets of binary R-C pairs.

As discussed above, a MOSFET may be modeled as a network of resistors and capacitors, e.g., Cauer model. Thus, the calculation techniques for V1[n+1] and V2[n+1] described above may be used to calculate the virtual junction temperature. FIG. 6C shows a circuit diagram of a Cauer model of a sample MOSFET. As shown, the circuit diagram of the model includes a network of resistors (R1, R2, R3, R4, R5, R6) and capacitors (C0, C1, C2, C3, C4, C5). This network of resistors and capacitors may be converted into sets of binary pairs. FIG. 6D shows sets of binary R-C pairs. Two compute elements (Compute Element 1 and Compute Element 2) may be used to solve the values of the thermal ladder when it is split into binary elements using a switching and timing scheme. The first compute element may be dedicated to solving the first RC time constant, and the second compute element may be shared by the other RC elements.

Figure 6E:
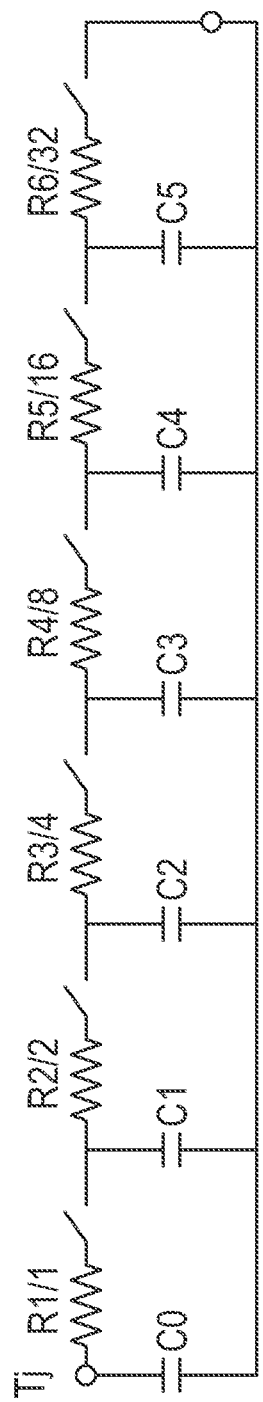
FIG. 6E shows a network with switched resistors.
Figure 6F:
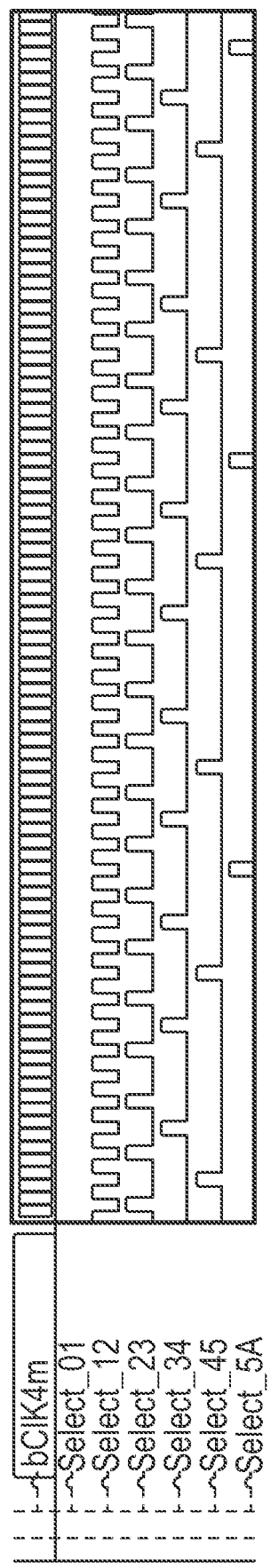
FIG. 6F shows a switch timing scheme.

FIG. 6E shows a network with switched resistors. Here, the resistors in the linear network may be replaced by switched resistors and the resistance values may be adjusted accordingly based on their binary position. R1 remains R1/1; R2 becomes R2/2; R3 becomes R3/4; R4 becomes R/8; R5 becomes R5/16; and R6 becomes R6/32 and so on. FIG. 6F shows a switch timing scheme. As shown, the switch timing may be set so that the resistor-connection timings are mutually exclusive. That is, only one resistor switch is closed at a time.

Therefore, one binary pair may be solved per cycle. With two compute elements, there may be mutually exclusive time slots for the second compute element such as 2Δt, 4Δt, 8Δt, 16Δt, 32Δt, 64Δt, etc. The first compute element may be dedicated to solving the first binary pair. The time constant of the first binary pair may be comparable to Δt. And the second compute element may then be shared by the other binary pairs based on their mutually exclusive time slots. The two compute elements may then be able to solve the values of the thermal ladder representing the MOSFET. The value of the first capacitor C0 may correspond to the junction temperature with a proportionality constant while the values of the capacitors may correspond to historical data.

Figure 7:
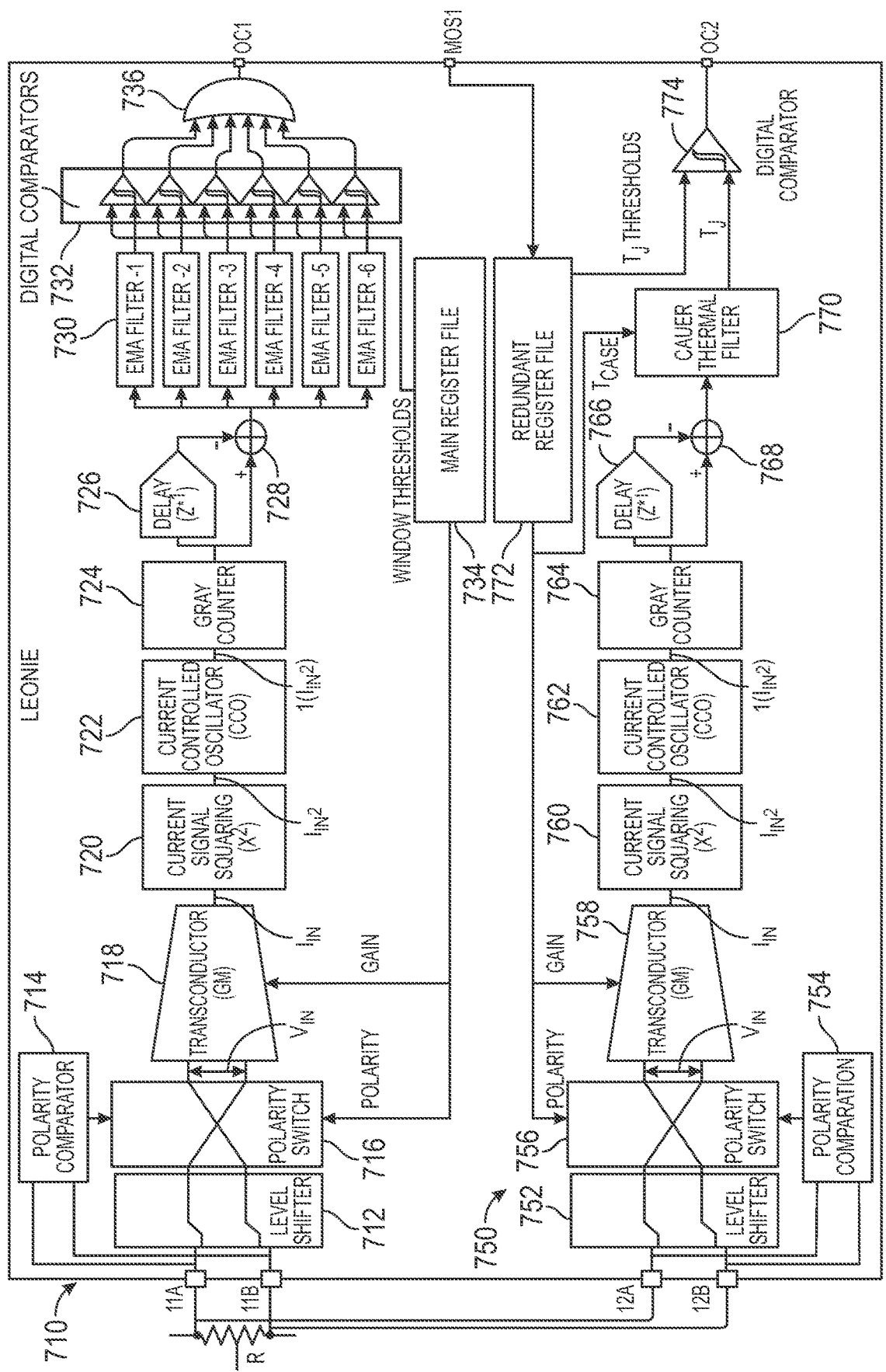
FIG. 7 illustrates an example portion of a BMS monitor.

FIG. 7 illustrates an example portion of a BMS monitor 700. The BMS monitor 700 may detect a voltage across a shunt resistor R (e.g., shunt resistor 112 of FIG. 1). Based on the detected voltage, the BMS monitor 300 may detect overcurrent events using two different detection techniques, detecting overcurrent event 1 (OC1) and event 2 (OC2), respectively. As explained above with reference to FIG. 1, the generation of either or both overcurrent events (OC1 and/or OC2) may trigger the disabling a switching device, such as a MOSFET (e.g., switching device 110 of FIG. 1).

The BMS monitor 700 may include two processing chains 710, 750 corresponding to the two different overcurrent detection techniques. The first processing chain 710 may include analog components: a level shifter 712, a polarity comparator 714, a polarity switch 716, a transconductor 718, a current signal squaring device 720, and a CCO 722.

The level shifter 712, polarity comparator 714, and polarity switch 716 may detect and adjust the voltage across the shunt resistor. The transconductor 718 may convert the detected (and adjusted) voltage to a current signal. The transconductor 718 may also apply a gain, which may be adjustable. The current signal squaring device 720 may square the current signal to generate a squared current signal, which is representative of a power signal. The CCO 722 may convert the squared current signal to a pulse sequence. The pulse sequence therefore may be current-controlled. Each pulse may correspond to a "unit of energy." The frequency of the pulse sequence may be proportional to the square of the detected voltage.

A counter 724 may count the number pulses in the generated pulse sequence. The counter 724 may be provided as a rotary counter, such as a gary counter.

Next, the pulse count may be received by a digital engine. Here, based on a system clock (SCLK), the previous value of the pulse count may be subtracted from the current value of the pulse count using a delay 726 and a subtractor 728 to generate an energy sequence (or power sequence) for a given clock cycle (or a set of clock cycles). The energy sequence may then be transmitted to a plurality of EMA filters 730. The EMA filters 730 may each be defined for a different time period, as discussed above. Each EMA filter 730 may determine the power dissipated in its respective time window. Digital comparators 732 may compare the average power from each EMA filter 730 to a respective power threshold. The power thresholds for the different windows may be configurable and be set based on register values from a main register file 734. The output of the digital comparators 732 may be fed into an OR gate 736. Therefore, if the determined average power for any time window exceeds its respective power threshold, the BMS monitor 700 may detect the occurrence of the overcurrent event OC1.

The second processing chain 750 may include analog components: a level shifter 752, a polarity comparator 754, a polarity switch 756, a current signal squaring device 760, and a CCO 762. These components may operate in the same or similar manner as their counterparts in the first processing chain 710. One or more of these components in the second processing chain 750 may be combined or integrated together with their counterparts in the first processing chain 710.

The second processing chain may also include a counter 764, a delay 766, and a subtractor 768 to generate an energy sequence. These components may operate in the same or similar manner as their counterparts in the first processing chain 710. One or more of these components in the second processing chain 750 may be combined or integrated together with their counterparts in the first processing chain 710.

In the second processing chain 750, a Cauer thermal filter 770 may receive the energy sequence. As described herein, the Cauer thermal filter 770 may also receive digital register values of the Cauer model of the switching device, e.g., $T_{CASE}$, and may calculate a virtual junction temperature Tj of the switching device (e.g., MOSFET). The digital register values may be configurable and may be set based on register values from a redundant register file 772 (or the main register file 734). A digital comparator 774 may compare the virtual junction temperature to a temperature threshold. The temperature threshold may be configurable and may be set based on register values from the redundant register file 772 (or the main register file 734). If the determined virtual junction temperature exceeds the temperature threshold, the BMS Monitor 700 may detect the occurrence of the overcurrent event OC1. In response to the detection of at least one of overcurrent events OC1 and OC2, the switching device may be disabled.

Various Notes

Each of the non-limiting aspects above can stand on its own or can be combined in various permutations or combinations with one or more of the other aspects or other subject matter described in this document.

The above detailed description includes references to the accompanying drawings, which form a part of the detailed description. The drawings show, by way of illustration, specific implementations in which the invention can be practiced. These implementations are also referred to generally as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other implementations can be used, such as by one of ordinary skill in the art upon reviewing the above description. The Abstract is provided to allow the reader to quickly ascertain the nature of the technical disclosure. It is submitted with the understanding that it will not be used to interpret or limit the scope or meaning of the claims Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed implementation. Thus, the following claims are hereby incorporated into the Detailed Description as examples or implementations, with each claim standing on its own as a separate implementation, and it is contemplated that such implementations can be combined with each other in various combinations or permutations. The scope of the invention should be determined with reference to the appended claims, along with the full scope of equivalents to which such claims are entitled.

What is claimed is:

1. A battery monitor for protecting a switching device used to supply power to a load, the battery monitor comprising:
   a converter circuit comprising an input to receive a voltage, and an oscillator to generate a pulse sequence based on the voltage; and
   a digital circuit comprising
   a first detector to detect an occurrence or non-occurrence of a first fault event for the switching device based on a determined characteristic of the pulse sequence measured over at least two different time windows, and
   a second detector to detect an occurrence or non-occurrence of a second fault event for the switching device by determining a modeled junction temperature of the switching device based on the pulsing sequence.

2. The battery monitor of claim 1, further comprising:
   a resettable counter to count pulses in the pulse sequence, wherein the digital circuit is configured to determine a count of pulses counted by the resettable counter and to determine a number of pulses received in a time period.

3. The battery monitor of claim 1, wherein the first and second fault events include an overcurrent condition.

4. The battery monitor of claim 1, wherein the battery monitor is configured to disable the switching device in response to detecting at least one of the first or second failure events.

5. The battery monitor of claim 1, wherein the switching device is a metal-oxide-semiconductor field-effect transistor (MOSFET).

6. The battery monitor of claim 1, wherein the first detector is configured to:
   determine power dissipated over the different time windows based on the pulse sequence,
   for each time window, compare the power dissipated for that time window to a respective power threshold for that window,
   in response to the power dissipated over at least one of the time windows exceeding the respective power threshold for that window, detect the first fault event.

7. The battery monitor of claim 1, wherein the second detector is configured to:
   obtain digital representations of resistor and capacitive values of a linear network of resistors and capacitors representing thermal properties of the switching device; and
   based on the resistor and capacitive values and the pulse sequence, determine the modeled junction temperature.

8. The battery monitor of claim 7, wherein the second detector is further configured to:
   group the resistor and capacitors into sets of binary pairs;
   assign a first computing element to a first set of the binary pairs;
   assign a second computing element to remaining sets of the binary pairs.

9. The monitor of claim 1, wherein the converter circuit further comprises:
   a voltage-to-power converter to convert the voltage to a squared current signal, and
   wherein the oscillator is configured to convert the squared current signal to the pulse sequence.

10. A method to protect a switching device used to supply power to a load, comprising:
    detecting an input voltage;
    generating a pulse sequence based on the input voltage;
    determining an occurrence or non-occurrence of a first fault event for the switching device based on a determined characteristic of the pulse sequence measured over at least two different time windows;
    determining an occurrence or non-occurrence of a second fault event for the switching device by determining a modeled junction temperature of the switching device based on the pulsing sequence; and
    disabling operation of the switching device, in response to determining the occurrence of the first or second fault events.

11. The method of claim 10, further comprising:
    counting pulses in the pulse sequence to generate a resettable count; and
    determining a number of pulses received in a time period based on the resettable count.

12. The method of claim 10, wherein the first and second fault events include an overcurrent condition.

13. The method of claim 10, wherein the switching device is a metal-oxide-semiconductor field-effect transistor (MOSFET).

14. The method of claim 10, wherein determining the occurrence or non-occurrence of the first fault event comprises:
   determining power dissipated over the different time windows based on the pulse sequence,
   for each time window, comparing the power dissipated for that time window to a respective power threshold for that window,
   in response to the power dissipated over at least one of the time windows exceeding the respective power threshold for that window, detecting the first fault event.

15. The method of claim 10, wherein determining the occurrence or non-occurrence of the second fault event comprises:
   obtaining digital representations of resistor and capacitive values of a linear network of resistors and capacitors representing thermal properties of the switching device; and
   based on the resistor and capacitive values and the pulse sequence, determining the modeled junction temperature.

16. The method of claim 15, further comprising:
   grouping the resistor and capacitors into sets of binary pairs;
   assigning a first computing element to a first set of the binary pairs;
   assigning a second computing element to remaining sets of the binary pairs.

17. An apparatus for protecting a switching device used to supply power to a load, the apparatus comprising:
   a converter circuit comprising an input to receive a voltage and an oscillator to generate a pulse sequence based on the voltage;
   a first fault detector including a plurality of timing filters and comparators to:
      determine power dissipated over a plurality of time windows based on the pulse sequence;
      for each time window of the plurality of time windows, compare the power dissipated for that time window to a respective power threshold for that window;
      based on the comparing, detecting an overcurrent event; and
      in response to detecting the overcurrent event, disabling the switching device;
   a second fault detector to detect an occurrence or non-occurrence of a fault event for the switching device by determining a modeled junction temperature of the switching device based on the pulsing sequence.

18. The apparatus of claim 17, further comprising:
   a resettable counter to count pulses in the pulse sequence, wherein the first fault detector is configured to determine a count of pulses counted by the resettable counter and to determine a number of pulses received in a time period.

19. The apparatus of claim 17, wherein the switching device is a metal-oxide-semiconductor field-effect transistor (MOSFET).

\* \* \* \* \*